(12) United States Patent
Ueno

(10) Patent No.: US 8,168,516 B2
(45) Date of Patent: *May 1, 2012

(54) METHOD OF FABRICATING SINGLE CRYSTAL GALLIUM NITRIDE SEMICONDUCTOR SUBSTRATE, NITRIDE GALLIUM SEMICONDUCTOR SUBSTRATE AND NITRIDE SEMICONDUCTOR EPITAXIAL SUBSTRATE

(75) Inventor: Masaki Ueno, Itami (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/980,923

(22) Filed: Dec. 29, 2010

(65) Prior Publication Data

US 2011/0092052 A1   Apr. 21, 2011

Related U.S. Application Data

(60) Continuation of application No. 12/817,817, filed on Jun. 17, 2010, now Pat. No. 7,883,996, which is a division of application No. 11/498,155, filed on Aug. 3, 2006, now Pat. No. 7,755,103.

(51) Int. Cl.
*H01L 33/00* (2010.01)
(52) U.S. Cl. ............ 438/483; 438/22; 438/46; 438/479; 257/190; 257/E33.003
(58) Field of Classification Search .............. 438/22, 438/143, 479, 483, 46; 257/190, E33.003
See application file for complete search history.

(56) References Cited

U.S. PATENT DOCUMENTS

2005/0093101 A1   5/2005   Matsumoto

FOREIGN PATENT DOCUMENTS

| JP | 2000-22212 | 1/2000 |
|---|---|---|
| JP | 2000-223743 | 8/2000 |
| JP | 2001-196632 | 7/2001 |
| JP | 2002-344088 A | 11/2002 |
| JP | 2003-133650 A | 5/2003 |
| JP | 2003-277195 A | 10/2003 |
| JP | 2003-327497 A | 11/2003 |
| JP | 2005-159047 A | 6/2005 |
| JP | 2005-206424 | 8/2005 |

OTHER PUBLICATIONS

Japanese Notice of Reasons for Rejection, w/ English translation thereof, issued in Japanese Patent Application No. JP 2004-014838 dated on Nov. 18, 2008.

*Primary Examiner* — Hung Vu
*Assistant Examiner* — Vernon P Webb
(74) *Attorney, Agent, or Firm* — McDermott Will & Emery LLP

(57) ABSTRACT

A method of fabricating a single crystal gallium nitride substrate the step of cutting an ingot of single crystal gallium nitride along predetermined planes to make one or more single crystal gallium nitride substrates. The ingot of single crystal gallium nitride is grown by vapor phase epitaxy in a direction of a predetermined axis. Each predetermined plane is inclined to the predetermined axis. Each substrate has a mirror polished primary surface. The primary surface has a first area and a second area. The first area is between an edge of the substrate and a line 3 millimeter away from the edge. The first area surrounds the second area. An axis perpendicular to the primary surface forms an off-angle with c-axis of the substrate. The off-angle takes a minimum value at a first position in the first area of the primary surface.

14 Claims, 12 Drawing Sheets

(A)

(B)

(C)

(A)

(B)

(A)

(B)

ID CRYSTAL GALLIUM NITRIDE
METHOD OF FABRICATING SINGLE CRYSTAL GALLIUM NITRIDE SEMICONDUCTOR SUBSTRATE, NITRIDE GALLIUM SEMICONDUCTOR SUBSTRATE AND NITRIDE SEMICONDUCTOR EPITAXIAL SUBSTRATE

RELATED APPLICATIONS

This application is a Continuation of U.S. patent application Ser. No. 12/817,817, filed on Jun. 17, 2010, now U.S. Pat. No. 7,883,996, which is a Divisional of U.S. patent application Ser. No. 11/498,155, filed on Aug. 3, 2006, now U.S. Pat. No. 7,755,103, the entire contents of each of which are incorporated by reference herein.

BACKGROUND OF THE INVENTION

1. Field of the Invention

The present invention relates to a method of fabricating a single crystal gallium nitride substrate, a gallium nitride substrate and a nitride semiconductor epitaxial substrate.

2. Related Background Art

Publication 1 (Japanese Patent Application Laid Open No. 2001-196632) discloses a nitride based compound semiconductor light emitting device. This nitride based compound semiconductor light emitting device has an active layer and an acceptor-doped layer of nitride-based compound semiconductor on the surface of a GaN substrate, and the surface of crystal orientation is inclined in the range of 0.05 degrees to 2 degrees with reference to <0001> direction.

Publication 2 (Japanese Patent Application Laid Open No. 2000-223743) discloses a nitride based semiconductor light emitting device. This nitride based semiconductor light emitting device has a light generating layer of nitride-based semiconductor on the surface of a GaN substrate. In the nitride based semiconductor light emitting device, the surface of crystal orientation is inclined in the range of 0.03 degrees to 10 degrees.

Publication 3 (Japanese Patent Application Laid Open No. 2000-22212) discloses a GaN wafer. This GaN wafer is formed by polishing. The off-angle of the surface of the GaN wafer is within 3 degrees, the variation of the off-angle is within 4 degrees over the surface. The warpage of the GaN wafer is within 200 micrometers.

SUMMARY OF THE INVENTION

Each of the nitride semiconductor light emitting device in Publications 1 and 2 discloses has a GaN base. The nitride semiconductor light emitting devices are fabricated by dividing the wafer into semiconductor dies. The size of each semiconductor die is at most about one millimeter. Nitride semiconductor light emitting devices as shown in Publications 1 and 2 are obtained from part of the GaN wafer because the surfaces of available GaN wafers at present have off-angle variations not less than desired off-angle range.

What is needed is to fabricate nitride semiconductor devices having desired device characteristics on a wider part of the surface of one GaN wafer.

It is an object of the present invention to provide a single crystal GaN substrate which can provide nitride semiconductor devices having desired device characteristics on a greater part of the surface thereof. It is another object to provide a method of fabricating a single crystal GaN substrate. It is still another object to provide a nitride semiconductor epitaxial substrate using this GaN substrate.

One aspect of the present invention is a method of fabricating a single crystal gallium nitride substrate. The method comprises the step of: cutting an ingot of single crystal gallium nitride along predetermined planes to make one or more single crystal gallium nitride substrates.

The ingot of single crystal gallium nitride is grown by vapor phase epitaxy in a direction of a predetermined axis. Each predetermined plane is inclined to the predetermined axis. Each substrate has a mirror polished primary surface. The primary surface has a first area and a second area. The first area is between an edge of the substrate and a line 3 millimeter away from the edge. The first area surrounds the second area. An axis perpendicular to the primary surface forms an off-angle with c-axis of the substrate. The off-angle takes a minimum value at a first position in the first area of the primary surface.

Another aspect of the present invention is a method of fabricating a single crystal gallium nitride substrate. The method comprises the step of slicing an ingot of single crystal gallium nitride along predetermined planes to prepare one or more single crystal gallium nitride slices. Each predetermined plane is inclined to a predetermined axis. The ingot of single crystal gallium nitride is grown by vapor phase epitaxy, and each single crystal gallium nitride slice has a slice surface.

The method further comprises the step of performing at least one process of polishing and grinding of the slice surface to form one or more single crystal gallium nitride substrates. Each substrate has a primary surface. The primary surface has a first and second areas. The first area is between an edge of the substrate and a line 3 millimeters away from the edge. The first area surrounds the second area. An axis perpendicular to the primary surface forms an off-angle with c-axis of the substrate. The off-angle takes a minimum value at a first position in the first area of the primary surface.

In the method according to the present invention, an axis perpendicular to the primary surface forms an angle greater than zero with c-axis of the substrate.

In the method according to the present invention, the off angle takes a maximum value at a second position on the primary surface, and the off angle makes substantially monotonic change on a segment from the first position to the second position.

In the method according to the present invention, the off angle takes a nonzero constant value on a curve on the primary surface and the curve terminates at the edge of the primary surface.

Still another aspect of the present invention is a gallium nitride substrate of single crystal gallium. The gallium nitride substrate comprises a primary surface. The primary surface has a first area and a second area. An off-angle formed by c-axis of the gallium nitride substrate with a axis perpendicular to the primary surface is greater than zero over the first and second areas.

Yet another aspect of the present invention is a gallium nitride substrate of single crystal gallium. The gallium nitride substrate comprises a primary surface. The primary surface has a first area and a second area. The first area is located between an edge of the primary surface and a line 3 millimeter apart from the edge. The off-angle formed by c-axis of the gallium nitride substrate with a axis perpendicular to the primary surface is greater than zero over the second area.

In the gallium nitride substrate according to the present invention, the off-angle takes a minimum in the first area.

In the gallium nitride substrate according to the present invention, the off-angle takes a value greater than zero on a curve on the primary surface, and the curve terminates on an edge of the primary surface.

In the gallium nitride substrate according to the present invention, a maximum distance between one position and another position on the edge of the primary surface is equal to or greater than 10 millimeters.

In the gallium nitride substrate according to the present invention, an area of the primary surface is equal to or greater than an area of 2-inch diameter circle.

In the gallium nitride substrate according to the present invention, the off-angle is equal to or greater than 0.15 degrees all over the second area.

In the gallium nitride substrate according to the present invention, the off-angle is equal to or greater than 0.3 degrees all over the second area.

In the gallium nitride substrate according to the present invention, the off-angle is less than 2 degrees all over the second area.

In the gallium nitride substrate according to the present invention, the off-angle is equal to or less than 0.7 degrees all over the second area.

An epitaxial substrate according to the present invention comprises: a gallium nitride substrate according to any one of the gallium nitride substrate; and one or more III-group nitride semiconductor film provided on the gallium nitride substrate.

An epitaxial substrate according to the present invention comprises: a gallium nitride substrate according to any one of the gallium nitride substrate; a first conductive type $Al_{X1}In_{Y1}Ga_{1-X1-Y1}N$ ($0 \leq X1 \leq 1$, $0 \leq Y1 \leq 1$, $0 \leq X1+Y1 \leq 1$) provided on the gallium nitride substrate; an active region including an $Al_{X2}In_{Y2}Ga_{1-X2-Y2}$ ($0 \leq X2 \leq 1$, $0 \leq Y2 \leq 1$, $0 \leq X2+Y2 \leq 1$) provided on the gallium nitride substrate; and a second conductive type $Al_{X3}In_{Y3}Ga_{1-X3-Y3}N$ ($0 \leq X3 \leq 1$, $0 \leq Y3 \leq 1$, $0 \leq X3+Y3 \leq 1$) provided on the gallium nitride substrate.

BRIEF DESCRIPTION OF THE DRAWINGS

The above objects and other objects, features, and advantages of the present invention will be understood easily from the following detailed description of the preferred embodiments of the present invention with reference to the accompanying drawings.

DETAILED DESCRIPTION OF THE PREFERRED EMBODIMENTS

The teachings of the present invention will readily be understood in view of the following detailed description with reference to the accompanying drawings illustrated by way of example. Referring to the accompanying drawings, embodiments of a nitride semiconductor wafer, the nitride semiconductor wafer and a nitride semiconductor epitaxial substrate of the present invention will be explained. When possible, parts identical to each other will be referred to with symbols identical to each other.

Figure 1:
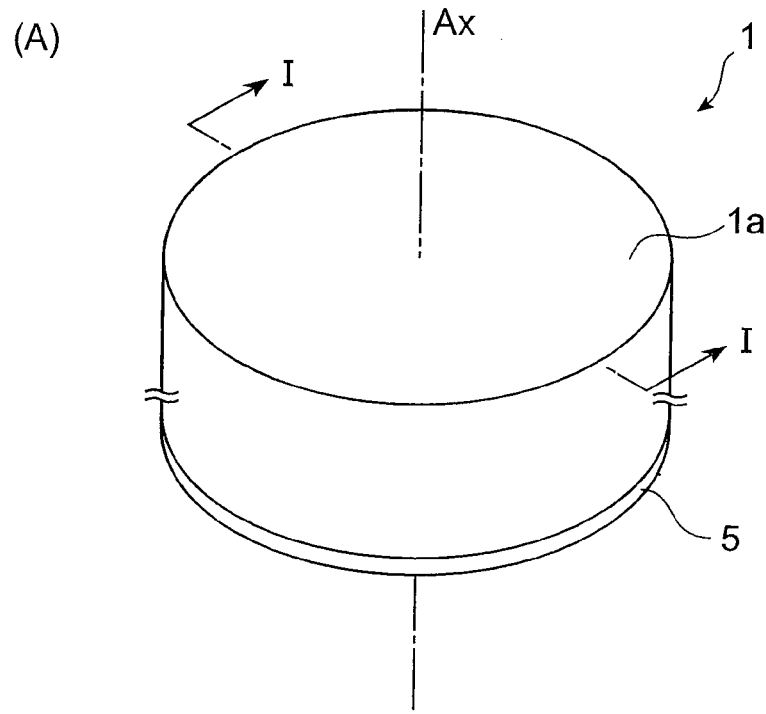
FIG. 1 is a view explaining a method of fabricating a single crystal gallium nitride substrate.
Figure 1:
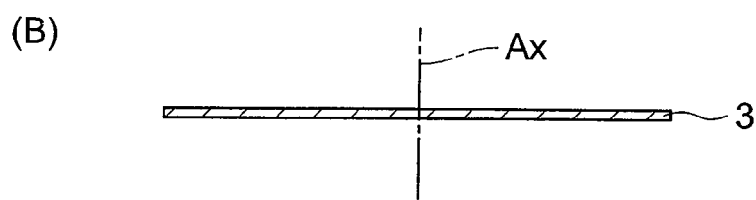
Figure 1:
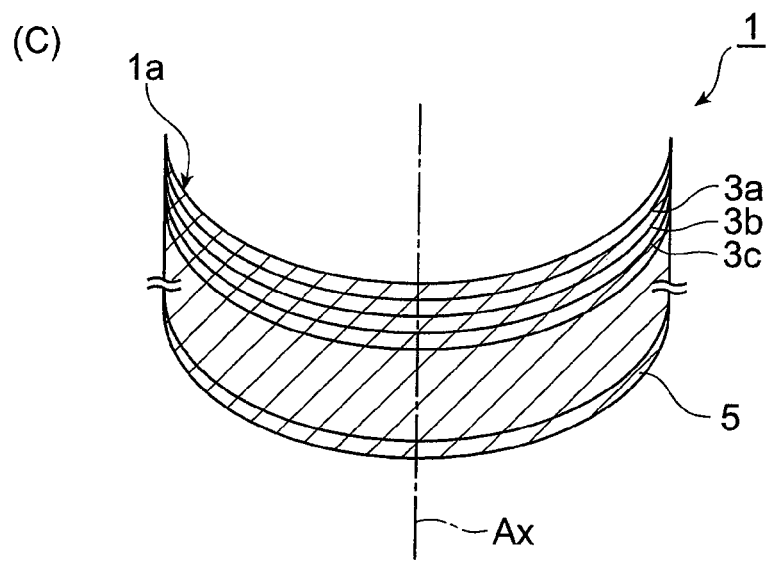

Part (A) in FIG. 1 shows a single crystal gallium nitride, part (B) shows a III-V compound semiconductor wafer, and part (C) shows a cross section, taken along I-I line in part (A), of the single crystal gallium nitride according to the present embodiment.

An ingot of gallium nitride semiconductor single crystal formed by a vapor phase deposition method is prepared. Referring to part (A) in FIG. 1, a gallium nitride semiconductor single crystal ingot 1 is shown. This ingot 1 is fabricated as follows. For example, a mask is formed on the III-V compound semiconductor substrate 3, such as GaAs (111) single crystal wafer, as shown in part (B) in FIG. 1. This mask has windows arranged in [11-2] direction and [-111] direction. A GaN buffer layer is grown in these windows at a lower temperature. Next, another GaN layer is deposited on the mask and GaN buffer layer at a higher temperature using a vapor phase deposition method, such as hydride vapor phase epitaxial growth (HVPE) method. After this growth, the GaAs wafer is eliminated therefrom to form a GaN single crystal substrate 5. GaAs can be removed by use of etchant, such as aqua regalis. A thick GaN epitaxial layer having a thickness of at least 10 millimeters is grown on the GaN single crystal semiconductor substrate 5 to form the ingot 1.

In order to form the single crystal ingot 1, crystal is grown by a vapor phase epitaxy in the direction Ax of a predetermined axis. As shown in part (B) of FIG. 1, the III-V compound semiconductor substrate 3 does not have a substantial warpage. The single crystal ingot 1 has a convex or concave warpage depending on its fabrication process condition and/or its thickness. In part (C) of FIG. 1, a GaN surface 1a is concave, and C-faces ((0001) face) 3a, 3b, 3c in the single crystal GaN ingot 1 is schematically shown.

Figure 2:
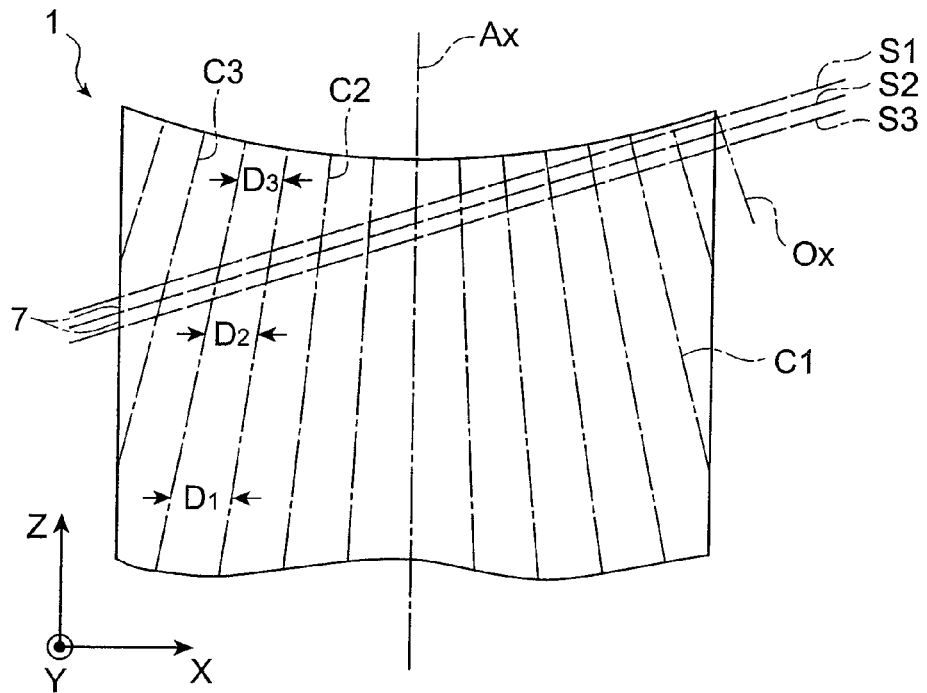
FIG. 2 is a view showing an ingot of single crystal gallium nitride semiconductor.
Figure 2:
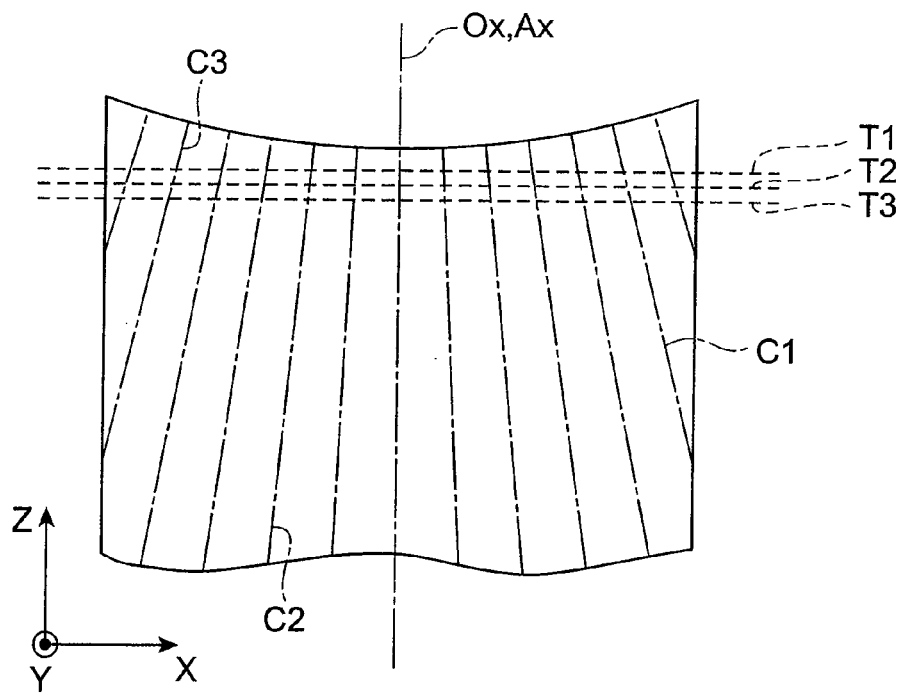

Parts (A) and (B) of FIG. 2 show cross sections taken along I-I line in Part (A) of FIG. 1. In part of FIG. 2, C-axes, C1, C2 and C3 are shown. The predetermined axis Ax extends on a C-axis. For example, distances D1, D2 and D3 between the axis C1 and axis C2 are changed to be narrow as a coordinate in the Z-axis direction is increased. These c-faces are concave or convex.

The GaN substrate is formed in the following method, for example. The single crystal ingot 1 is cut along predetermined planes S1, S2 and S3 to form one or more single crystal GaN substrates. These predetermined planes are inclined with reference to the axis Ax extending in the longitudinal direction of the ingot 1.

These predetermined planes S1, S2 and S3 are not perpendicular to any C-axes of the ingot 1. The predetermined planes S1, S2 and S3 are perpendicular to an axis Ox that does not intersect with the ingot 1. For example, the plane S1 (planes S1 and S2 in the same manner) intersects with a C-axis of the ingot 1 to form an angle that monotonically increases as X coordinate of the intersection is increased.

In part (B) of FIG. 2, C axes C1 C2 and C3 are shown as in part (A) of FIG. 2. The axes Ax and Ox extend on a certain C axis and the Ox axis extends in the longitudinal direction of the ingot 1.

In an example of part (B) in FIG. 2, one or more GaN single crystal substrates are formed by cutting the single crystal ingot 1 along predetermined planes T1, T2 and T3.

These predetermined planes T1, T2 and T3 are perpendicular to the axis Ox in the ingot 1. For example, the plane T1 (planes T1 and T2 in the same manner) intersects with a C-axis passing through a position of the ingot 1 to form an angle that monotonically increases as the relevant intersection is spaced apart from the axis Ox in the X-axis direction.

Figure 3:
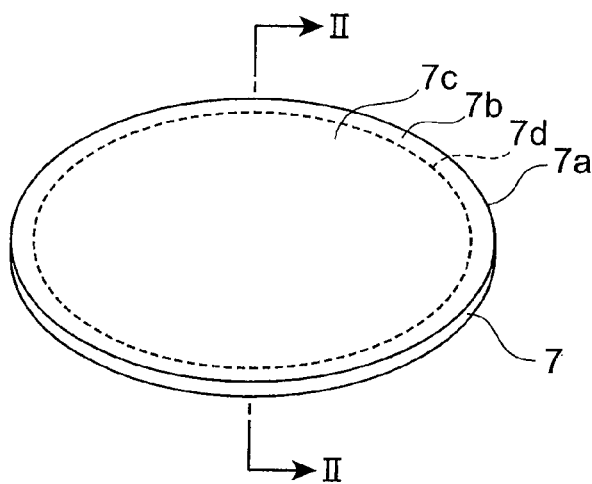
FIG. 3 is a view showing a single crystal gallium nitride substrate.
Figure 3:
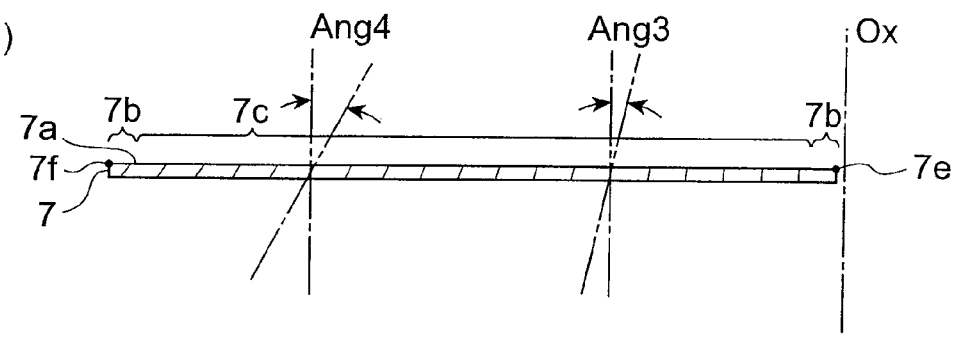
Figure 3:
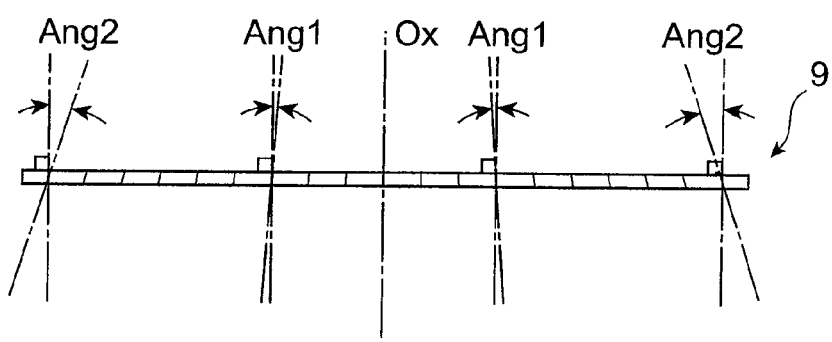
Figure 3:
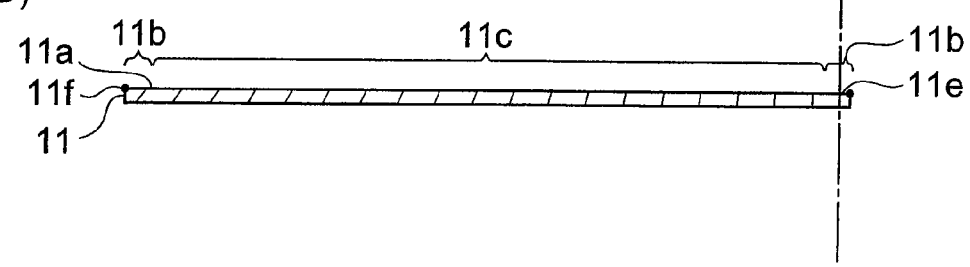

Part (A) in FIG. 3 shows the single crystal GaN substrate obtained by the method in part (A) of FIG. 2. The surface 7a of the single crystal GaN substrate 7 is mirror finished. The surface 7a of the single crystal GaN substrate 7 has a first area 7b between the edge of the substrate 7 and a line distanced from this edge by 3 millimeters, and a second area 7c inside the first area 7b. The dash line in part (A) of FIG. 3 indicates the boundary between the first areas 7b and second areas 7c.

Part (B) in FIG. 3 is a cross sectional view, taken along II-II line, showing one substrate of the substrates fabricated by slicing the ingot 1 along the planes S1, S2 and S3. Part (C) in FIG. 3 is a cross sectional view showing one substrate of the substrates fabricated by slicing the ingot 1 along the planes T1, T2 and T3. A number of C axes are depicted in solid line in parts (B) and (C) of FIG. 3. In a single crystal GaN substrate 9, the off-angle at the middle of the surface of the GaN substrate 9 is zero and the off-angle (Ang1, Ang2: Ang1<Ang2) at a position on this surface is increased as the relevant position moves apart from the center. On the contrary, the surface 7a of the GaN substrate 7 does not have an area on which the off-angle is zero. In the method according to this embodiment, the ingot 1 is sliced along the predetermined planes to form the single crystal GaN substrate 7, and the off-angle on the surface 7a becomes minimum at a first position in the first area 7b (at a position 7e on the edge in the present example). The surface of a film grown on an area of the substrate on which the off-angle is close to zero has the surface morphology of six-sided pyramid, which may prevent the further improvement of semiconductor devices formed thereon. The off-angle is greater than zero all over the surface, and takes the minimum value at the position 7e in the first area 7b and this minimum is not zero.

At a position in the first and second areas 7b and 7c, the axis perpendicular to the primary surface 7a form a nonzero angle (Ang3, Ang4: Ang3<Ang4) with the C-axes. The present fabrication method provides a single crystal GaN substrate the surface of which does not have an off-angle of zero. According to this single crystal GaN substrate, since the off-angle is greater than zero all over the primary surface, a semiconductor film having an excellent surface morphology can be formed on single crystal GaN substrate.

Figure 4:
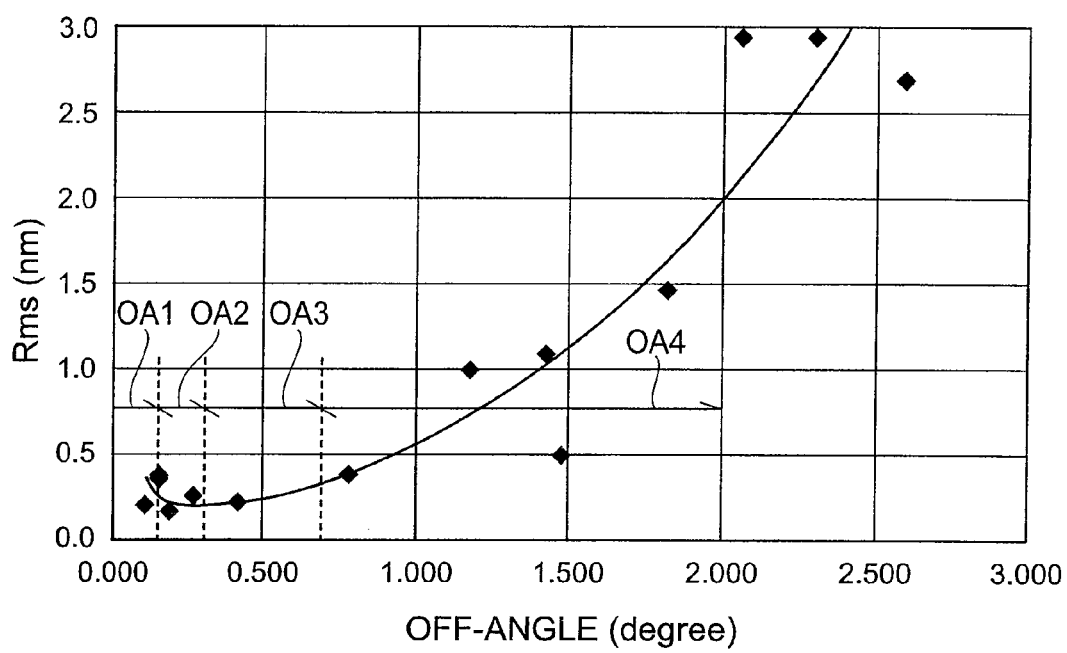
FIG. 4 is a graph showing the relationship between the surface roughness of a GaN film on a GaN wafer and off-angle of the GaN wafer.

Part (D) of FIG. 4 shows a single crystal GaN substrate fabricated by a modified method thereof. According to this method, the ingot of single crystal GaN is grown in the predetermined Ax by a vapor phase epitaxy, and is sliced along the predetermined planes S1, S2 and S3 to form one or more single crystal GaN slices. For example, a single crystal GaN substrate 11 is formed by providing the surface of one of the single crystal GaN slices with the processing of grinding and/or polishing.

Provided are the single crystal GaN substrate 11 the off-angle of which takes the minimum at the first position in the first area 7b according to the present fabrication method, since the single crystal slices are formed by slicing the ingot along the predetermined planes.

The off-angle takes the minimum at the position 11e in the first area 11b of the primary surface 11a. The minimum is equal to zero in the present example. In the fabrication of semiconductor devices, the outer region 11b of the substrate 11 (outside a line spaced 3 millimeters apart from the substrate edge) is not used for fabricating the semiconductor devices, and thus this outer region may contain a position or an area in which the off-angle is zero.

According to this GaN substrate 11, the off-angle is greater than zero all over the second area 11c of the primary surface, a semiconductor film having an excellent surface morphology in the second area 11c can be deposited.

In the substrate 7 (11) in part (B) of FIG. 3 (part (D) of FIG. 3), the off-angle takes the minimum at the first position 7e (11e) on the primary surface 7a (11a) and takes the maximum at the second position 7f (11f). The off-angle is monotonically changed on the segment that connects the first position of the minimum off-angle to the second position of the maximum off-angle. According to the substrate 7, 11, since the off-angle monotonically is changed on this segment, the single crystal GaN substrate 7, 11 does not have a region in which the off-angle on the second area 7c (11c) is zero.

In the GaN substrate 7, 11, the maximum distance from the first position to the second position on the edge of the GaN substrate 7, 11 can be greater than 10 millimeters. Further, according to the GaN substrate 7, 11, the area of the primary surface thereof is equal to or greater than that of the circle of 2-inch diameter.

FIG. 4 is a graph showing the relationship between the surface roughness of a GaN film on a GaN wafer and the off-angle. The horizontal axis indicates the off-angle of the GaN substrate and the longitudinal axis indicates the surface roughness (average root mean square surface roughness: Rms) of the GaN film. The thickness of the GaN film deposited on the GaN substrate is 2 micrometers.

In order to use a GaN supporting body having the off-angle of a desired value in the above experiment, a GaN substrate of 2-inch diameter fabricated in the above method is divided into a number of dedicated GaN supporting bodies for experiments each having 10-millimeter square. Since the off-angle variation of the GaN substrate that the inventers can be obtained is about 0.3 degrees, the off-angle variation of the GaN supporting bodies is estimated to be within about 0.06 degrees. The thickness variation of the GaN supporting bodies is within 1 micrometer.

A GaN film is deposited on each GaN supporting body. The Hall measurement of the deposited film shows as follows: the mobility is 200 $cm^2V^{-1}$ $sec^{-1}$; the carrier concentration $5 \times 10^{18}$ $cm^{-3}$; the full-width half maximum by OMEGA scanning of (0002) face using X ray diffraction method is 100 arcsec. Accordingly, this GaN film has an excellent crystal quality. In this measurement, a crystal analysis X ray diffraction apparatus for material of thin films, for example X' Pert MRD system, is used.

The surfaces of the epitaxial films are analyzed using an Atomic Force Microscope apparatus. As shown in FIG. 4, the surface roughness becomes large as the off-angle is increased in the range of the off angle equal to or more than 0.5 degrees. GaN-based films, such as GaN film, grown on the GaN supporting bodies are observed by use of a differential interference microscope and the observations are summarized as below.

As shown in FIG. 4, projections and depressions shaped in six-sided pyramids are observed in the range OA1 of the off-angle equal to or less than 0.15 degrees. Step-like patterns are observed in the range OA2 of 0.15 to 0.3 degrees. Planar surfaces are provided in the range OA3 of 0.3 to 0.7 degrees. Scratch-like patterns are observed in the range OA4 of 0.7 to 2 degrees. Deep scratch patterns are observed in the range equal to or more than 2 degrees.

In the single crystal GaN substrate according to the embodiment, the off-angle distribution on the primary surface is adjusted. By depositing a $Al_{X1}In_{Y1}Ga_{1-X1-Y1}N$ ($0 \leq X1 \leq 1, 0 \leq Y1 \leq 1, 0 \leq X1+Y1 \leq 1$) film, such as GaN film, on the adjusted GaN substrate its surface morphology and surface roughness (Rms) is becomes excellent as shown below.

For example, the surface morphology shows six-sided pyramid-like, step-like, atomic step-like, or scratch-like patterns and its surface roughness (Rms) is reduced to be equal to or less than 2 nanometers. Light emitting diodes fabricated on this substrate near uniformly emit light. The primary surface of surface roughness less than 2 nanometers can be favorable for a base region for a quantum well structure active region including a well layer of 1 to 5 nanometer thickness.

For example, in the off-angle range of 0.15 to 2 (exclusive) degrees ($0.15 \leq$ off-angle$<2$), the surface morphology shows step-like, atomic step-like and scratch-like patterns and the surface roughness (Rms) is reduced to be 2 nanometers at a maximum. Light emitting diodes fabricated on this substrate near uniformly emit light.

For example, in the off-angle range of zero (exclusive) to 0.7 degrees ($0<$off-angle$\leq 0.7$), the surface morphology shows six-sided pyramid-like, step-like and atomic step-like patterns and the surface roughness (Rms) is reduced to be 0.5 nanometers at a maximum. Light emitting diodes fabricated on this substrate near uniformly emit light.

For example, in the off-angle range of 0.15 (exclusive) to 0.7 degrees ($0.15<$off-angle$\leq 0.7$), the surface morphology shows step-like and atomic step-like patterns and the surface roughness (Rms) is reduced to be 0.5 nanometers at a maximum. Light emitting diodes fabricated on this substrate uniformly emit light.

For example, in the off-angle range of 0.3 (exclusive) to 0.7 degrees ($0.3<$off-angle$\leq 0.7$), the surface morphology has shows flatness corresponding to atomic step-like patterns and the surface roughness (Rms) is reduced to be 0.3 nanometers at a maximum. Light emitting diodes fabricated on this substrate uniformly emit light all over the emitting surface. For example, since the off-angle variation in a 2-inch diameter GaN wafer is within 0.3 degrees, the excellent surface morphology is realized all over the surface of this GaN substrate.

Figure 5:
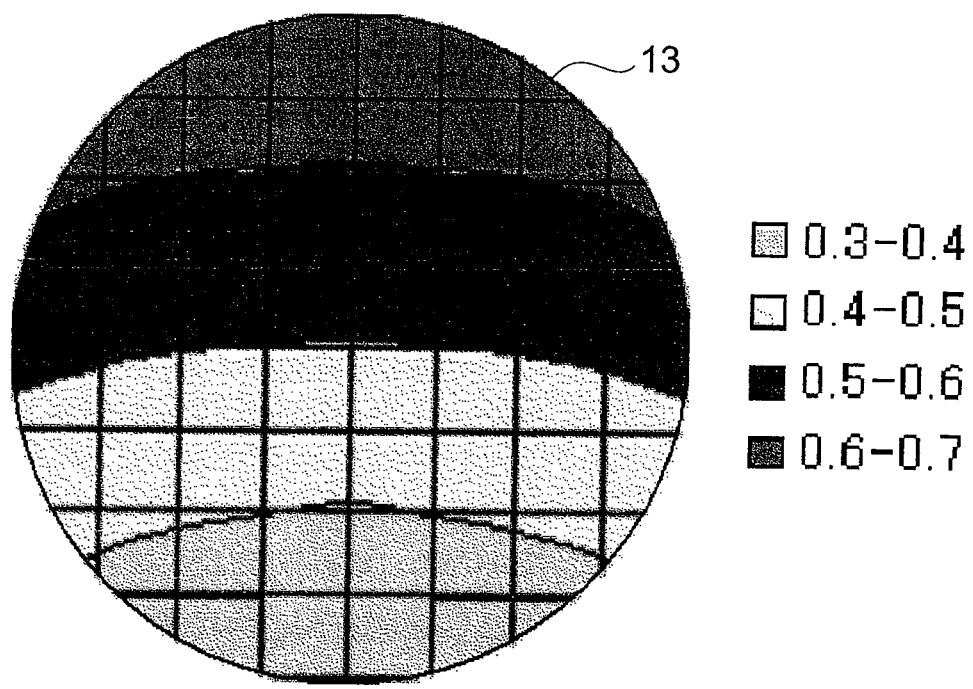
FIG. 5 is a view showing the distribution of off-angle over the surface of the GaN single crystal substrate shown in part (B) of FIG. 3.

FIG. 5 shows the off-angle distribution on the primary surface of the GaN single crystal substrate shown in part (B) of FIG. 3. The minimum and maximum values of the off-angle are located in a region between the edge and a line 3 millimeters apart from this edge. In this substrate 13, the off-angle variation is in the range of 0.3 to 0.7 degrees. In the distribution shown in FIG. 5, stripe regions having the respective off-angle ranges of 0.3 to 0.4 degrees, 0.4 to 0.5 degrees, 0.5 to 0.6 degrees and 0.6 to 0.7 degrees are sequentially arranged from the bottom. When a III-group nitride film is grown on the present substrate of 2-inch diameter, the surface morphology of the deposited film is improved over all the surface.

Figure 6:
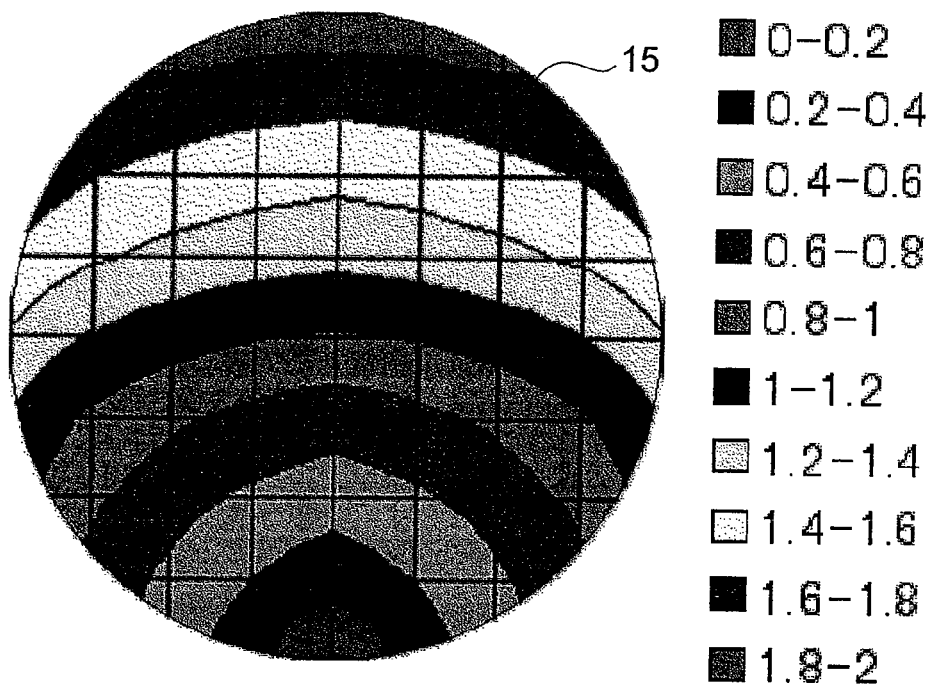
FIG. 6 is a view showing the distribution of off-angle over the surface of the GaN single crystal substrate shown in part (D) of FIG. 3.

FIG. 6 shows the off-angle distribution on the primary surface of the GaN single crystal substrate shown in part (D) of FIG. 3. In the off-angle distribution in FIG. 6, stripe regions having the respective off-angle ranges of 0.2 to 0.4 degrees, 0.4 to 0.6 degrees, 0.6 to 0.8 degrees, 0.8 to 1.0 degrees, 1.0 to 1.2 degrees, 1.2 to 1.4 degrees, 1.4 to 1.6 degrees, 1.6 to 1.8 degrees and 1.8 to 2.0 degrees are sequentially arranged from the bottom up to the figure next to a stripe region having the off-angle range of 0 to 0.2 degrees. In this substrate 15, the off-angle at a position near the edge is zero. The off-angle is increased at a position as this position is distanced from the edge. At a position on the other side of the edge, the off-angle is equal to or less than 2 degrees and is appropriate to 2 degrees.

Figure 7:
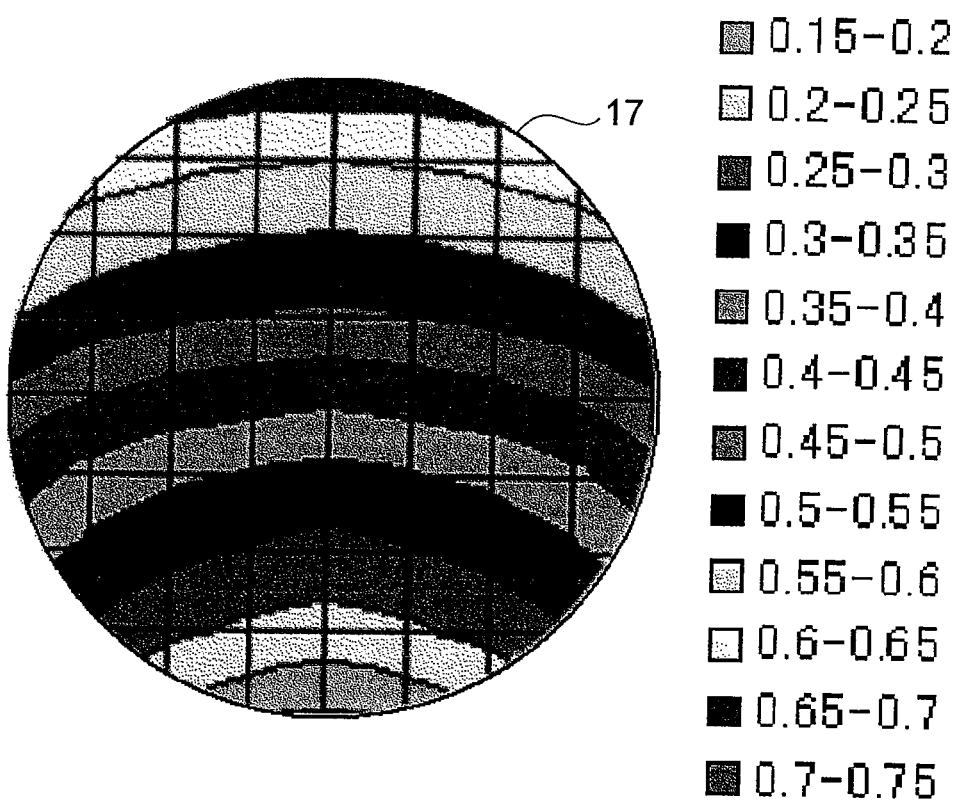
FIG. 7 is a view showing the distribution of off-angle over the primary surface of another GaN single crystal substrate.

FIG. 7 shows the off-angle distribution on the primary surface of another single crystal GaN substrate. In this substrate 17, the off angle does not take zero at any position all over the primary surface. In the distribution of FIG. 7, stripe regions having the respective off-angle ranges of 0.2 to 0.25 degrees, 0.25 to 0.3 degrees, 0.3 to 0.35 degrees, 0.35 to 0.4 degrees, 0.4 to 0.45 degrees, 0.45 to 0.5 degrees, 0.5 to 0.55 degrees, 0.55 to 0.6 degrees, 0.6 to 0.65 degrees, 0.65 to 0.7 degrees and 0.7 to 0.75 degrees are sequentially arranged from the bottom to top of the figure next to a stripe region having the off-angle range of 0.15 to 0.2 degrees. The minimum off-angle and the maximum off-angle are located in a range between the edge of the substrate and a line distanced from this edge by 3 millimeters. The off-angle minimum is 0.15 degrees and the off-angle maximum is 0.7 degrees. When a GaN film is epitaxially grown on this substrate having the above off-angle variation, the surface morphology is step-like or planar. The curvature radius of C-plane is 5.5 meters.

Figure 8:
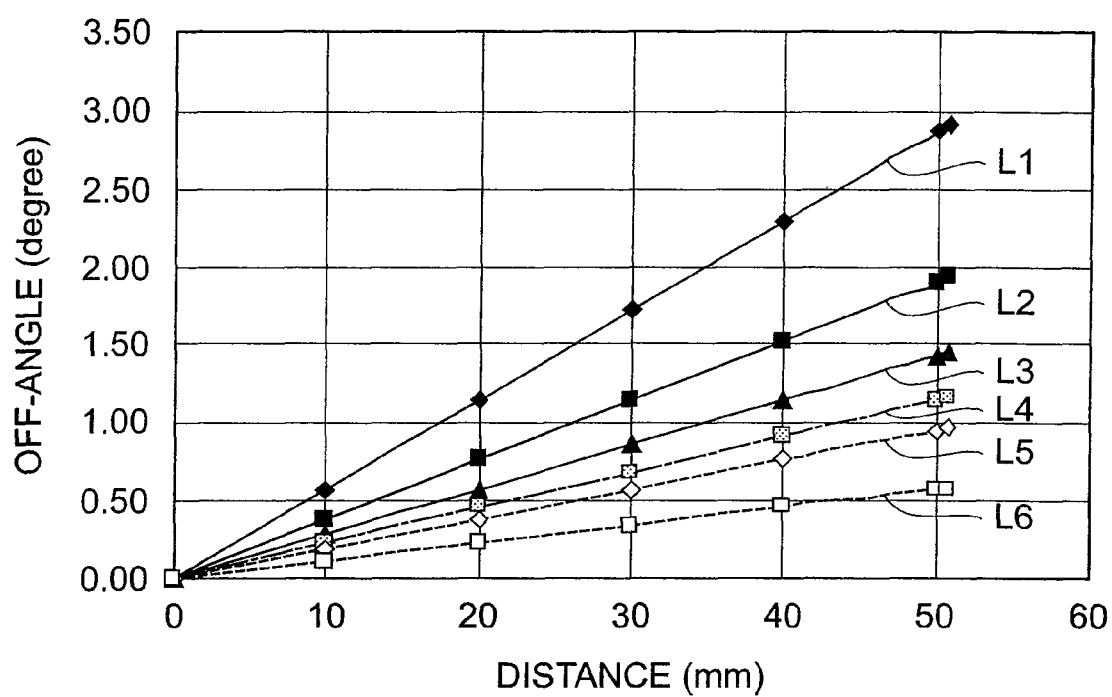
FIG. 8 is a graph showing relationship between off-angle and the distance from the reference point.

When off-angle Angle is small, the off angle is expressed in the following relationship using curvature radius R and distance L from the reference position at which the off-angle is zero. FIG. 8 shows the relationship between the distance from the reference position and the off-angle. In FIG. 8, lines L1 to L6 for curvature radius are shown, and these lines correspond to the curvature radius R of C-plane. The lines L1 to L6 show the relationships for the curvature radius of 1 meter, 1.5 meters, 2.0 meters, 2.5 meters, 3 meters and 5 meters. In the 2-inch diameter substrate, if the curvature radius R of C-plane is equal to or more than 1.5 meters, the off-angle variation is not more than 2 degrees. Further, an ingot having the curvature radius R of C-plane of 7.5 meters provides the off angle variation shown in FIG. 5.

As explained above, GaN ingots have convex or concave warpage. When planar GaN substrate 11 is formed by providing slices from such a GaN ingot with the processing of grinding and/or polishing, the off-angle is varied over the primary surface. In the primary surface, lines indicating the same off-angles are drawn as concentric circles and/or concentric circle arcs.

When a III-group nitride single crystal film is epitaxially grown on the substrate having a region which has the off-angle of zero or appropriate zero, the surface morphology of this film is not good on this region. Semiconductor devices on the region of better surface morphology have excellent characteristics as compared to those on the region of worse surface morphology. If the off-angle of regions of the substrate on which semiconductor devices are formed is equal to or approximate zero, yield in the semiconductor device fabrication is lowered.

If the primary surface does not have a region of zero off-angle, the surface morphology is improved and thus the yield of the semiconductor device fabrication is enhanced.

On the contrary, the characteristics of semiconductor devices formed on the outer region of the substrate are not excellent, for example, due to inhomogeneous gas flow in epitaxial growth. Thus, this outer region is not used for the fabrication of semiconductor devices. Accordingly, it is preferable that the ingot be sliced to form a substrate(s) in which a position of zero off-angle is located in the outer region.

Referring FIGS. 5, 6 and 7, lines indicate the same off-angles on the primary surface of the single crystal GaN substrate. These lines correspond to off-angle values more than zero, respectively. These lines terminate at the edge of the primary surface (the edge of the substrate), and are not closed on the surfaces 7a, 11a of the substrates 7, 11. These lines are concave or convex curves.

According to the GaN substrates 7 and 11, it is preferable that the off-angle be equal to or more than 0.15 degrees over the second area of the primary surfaces 7c, 11c. The surface morphology of a film deposited on the substrate 7, 11 does not show six-sided pyramid patterns. Further, it is preferable that the off-angle be equal to or more than 0.15 degrees over the first and second area of the primary surfaces 7a, 11a.

According to the GaN substrates 7 and 11, it is preferable that the off-angle be equal to or more than 0.3 degrees over the second area of the primary surface 7c, 11c. The surface morphology of a film deposited on the substrate 7, 11 becomes substantially flat. Further, it is preferable that the off-angle be equal to or more than 0.3 degrees over the first and second area of the primary surface 7a, 11a.

In the GaN substrate 7, 11, it is preferable that the off-angle be equal to or more than 2 degrees over the second area of the primary surfaces 7c, 11c. The surface morphology of a film deposited on the substrate 7, 11 does not show scratch-like roughness.

In the GaN substrate 7, 11, it is preferable that the off-angle be equal to or more than 0.7 degrees over the second area 7c, 11c. The surface morphology of a film deposited on the substrate 7, 11 has six-sided pyramid patterns, step-like patterns, or atomic step-like patterns, and the surface roughness (Rms) is educed to be 0.5 nanometers at a maximum. Further, it is preferable that the off-angle be equal to or more than 0.7 degrees over the first and second area 7b, 11b, 7c, 11c of the primary surfaces 7a, 11a.

As explained above, the present embodiment can provide the GaN substrate for yielding more nitride semiconductor devices, and the method of fabricating the GaN substrate.

Figure 9:
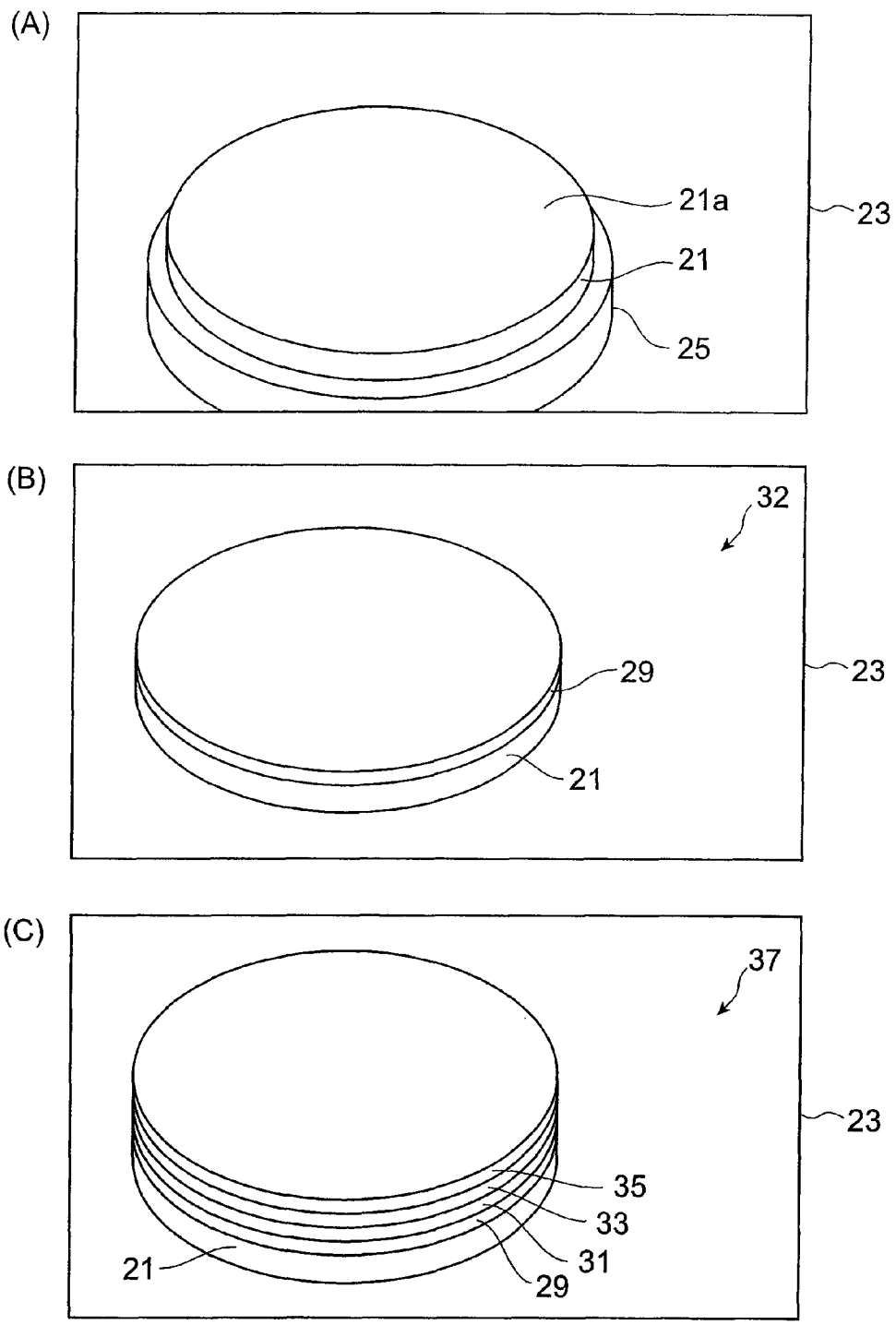
FIG. 9 is a view showing process steps for the method of fabricating a gallium nitride-based semiconductor device and the method of forming a gallium nitride-based epitaxial substrate.
Figure 10:
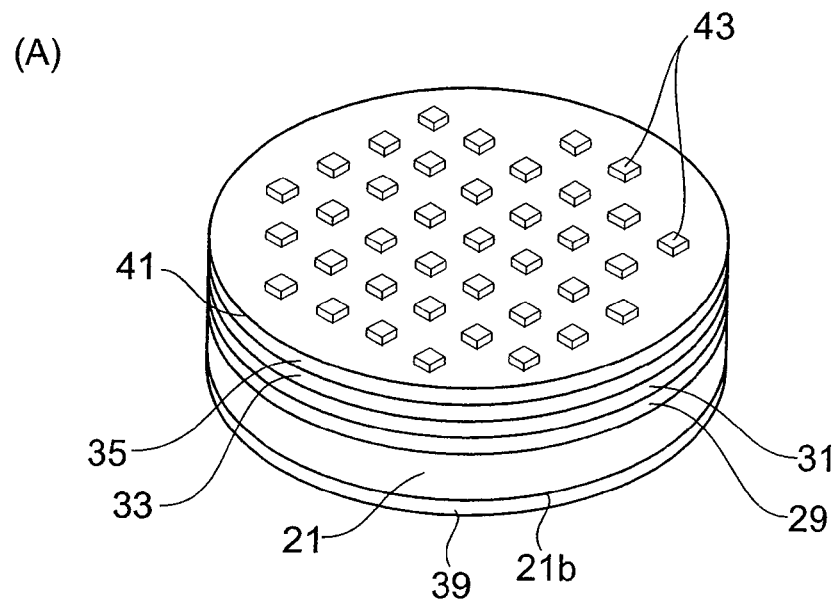
FIG. 10 is a view showing process steps for the method of fabricating a gallium nitride-based semiconductor device and the method of forming a gallium nitride-based epitaxial substrate.
Figure 10:
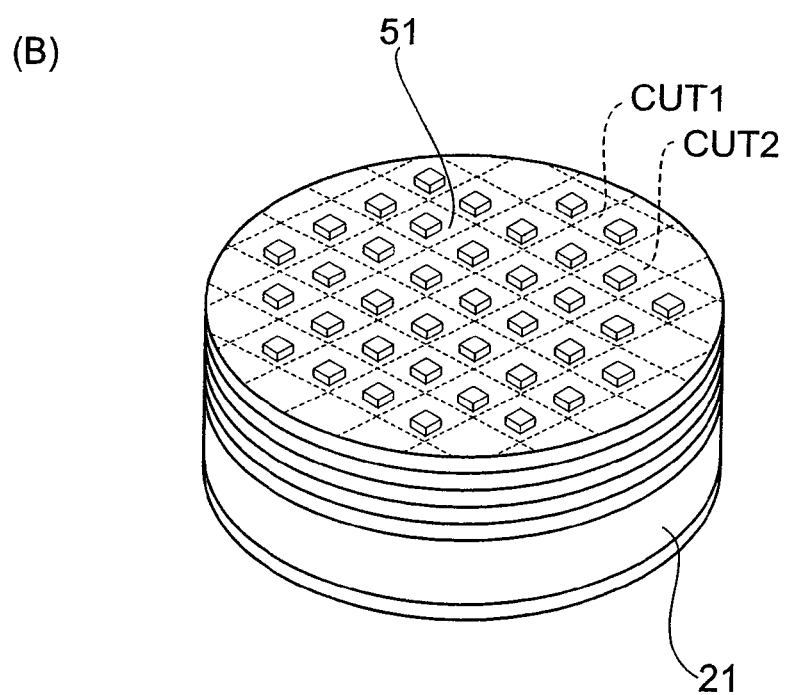

Parts (A) to (C) in FIG. 9, parts (A) and (B) in FIG. 10 show the method of forming a nitride semiconductor epitaxial substrate and the method of fabricating GaN-based semiconductor device according to the embodiment.

A single crystal GaN substrate 21 is prepared. The single crystal GaN substrate 21 can be fabricated by the method according to the first embodiment. Prior to the deposition of a III-group nitride film, the preprocessing of the single crystal GaN substrate 21 is performed in the OMVPE apparatus 23. The single crystal GaN substrate 21 is provided on the suceptor 25 in the OMVPE apparatus 23. The single crystal GaN substrate 21 is thermally processed while flowing process gas to flatten the surface of the substrate 21. This thermal process onto the surface 21a of the substrate 21 reduces scratches caused by mechanical polishing. In the preferable example, the process gas contains $NH_3$ and $H_2$.

As shown in part (B) in FIG. 9, a GaN-Based film 29 is formed on the primary surface 21a of the substrate 21 while supplying raw material gas. In the present example, a GaN film is deposited directly on the primary surface 21a of the substrate 21 using the OMVPE apparatus 23. The temperature of the substrate is set at a temperature higher than the temperature in the preprocessing step. The raw material gas contains trimethyl-gallium (TMG), ammono ($NH_3$), hydrogen ($H_2$) and nitrogen ($N_2$). If required, silane ($SiH_4$) gas can be used as n-type dopant. After this step, a nitride semiconductor epitaxial substrate 32 including a III-group nitride film formed on the GaN substrate.

As shown in part (C) in FIG. 9, a device region is formed. One or more another III-group nitride films 31, such as an active layer, for the device region are formed on the primary surface 21a. The active layer can have a single quantum well structure (SQW) or a multiple quantum well structure (MQW). In the present example, the active layer of the MQW structure is formed, and the temperature of the substrate is lowered as compared to the substrate temperature for the GaN film growth. For example, an InGaN film is grown for a well layer of the MQW structure, and another InGaN film of the bandgap greater than that of the well layer is grown for a barrier layer of the MQW structure. For example, the MQW structure of five well layers is formed for a light emitting diode. In this step, an epitaxial substrate including a number of III-group nitride films has formed on the GaN substrate is obtained.

Next, as shown in part (C) in FIG. 9, a still another III-group nitride film 33 is formed on the primary surface 21a of the GaN substrate 21. In the present example, an AlGaN film is grown on the active layer using the OMVPE apparatus 23. The substrate temperature is higher than the growth temperature for the active layer. A raw material gas for this growth can contain trimethyl-gallium (TMG), trimethyl-aluminum (TMAl), ammono ($NH_3$), hydrogen ($H_2$) and nitrogen ($N_2$). As required, cyclo-penta-dienyl-magunesium ($CP_2MG$) is used as p-type dopant. For example, a Mg-doped AlGaN film are grown to obtain p-type AlGaN film. After this step, a nitride semiconductor epitaxial substrate including a number of III-group nitride films has formed on the GaN substrate.

As shown in part (C) in FIG. 9, another III-group nitride-based film 35 is formed on the primary surface 21a of the GaN substrate 21. In the present example, a Mg-doped GaN film is grown on the p-type AlGaN film to form the p-type GaN film. In this step, a nitride semiconductor epitaxial substrate 37 including a number of III-group nitride films formed on the GaN substrate.

As shown in part (C) in FIG. 9, an n-type ohmic electrode 39 is formed on the backside 21b of the GaN substrate. A p-type ohmic electrode 41 and a pad electrode 43 are formed on the epitaxial film formed in the step in part (C) in FIG. 9.

After the formation of the pad electrode 43, the substrate is cut along the broken lines CUT1 and CUT2 to form semiconductor light emitting devices 51, such as light emitting diode. By use of the above steps, a III-group nitride semiconductor device is manufactured.

As explained above, the present embodiment provides the method of fabricating a nitride-based semiconductor device. Further, the present embodiment also provides the method of fabricating a nitride semiconductor epitaxial substrate. This nitride semiconductor epitaxial substrate includes a single crystal GaN substrate having a primary surface of the predetermined off-angle variation, one or more III-group nitride semiconductor layers formed on the single crystal GaN substrate. The nitride semiconductor substrate provides these III-group nitride semiconductor layers with excellent surface morphology.

The following epitaxial substrate can be fabricated using the method of making a nitride semiconductor epitaxial substrate according to the present embodiment. This nitride semiconductor epitaxial substrate comprises a single crystal GaN substrate having a primary surface of the predetermined off-angle variation, a first conductive type $Al_{X1}In_{Y1}Ga_{1-X1-Y1}N$ ($0 \leq X1 \leq 1$, $0 \leq Y1 \leq 1$, $0 \leq X1+Y1 \leq 1$) film formed on the GaN substrate, an active layer including an $Al_{X2}In_{Y2}Ga_{1-X2-Y2}N$ ($0 \leq X2 \leq 1$, $0 \leq Y2 \leq 1$, $0 \leq X2+Y2 \leq 1$) film formed on the GaN substrate, and a second conductive type $Al_{X3}In_{Y3}Ga_{1-X3-Y3}N$ ($0 \leq X3 \leq 1$, $0 \leq Y3 \leq 1$, $0 \leq X3+Y3 \leq 1$) film formed on the GaN substrate. The active layer is provided between the first conductive type $Al_{X1}In_{Y1}Ga_{1-X1-Y1}N$ film and the second conductive type $Al_{X3}In_{Y3}Ga_{1-X3-Y3}N$ film. According to the epitaxial substrate, the first conductive type $Al_{X1}In_{Y1}Ga_{1-X1-Y1}N$ ($0 \leq X1 \leq 1$, $0 \leq Y1 \leq 1$, $0 \leq X1+Y1 \leq 1$) film, the $Al_{X2}In_{Y2}Ga_{1-X2-Y2}N$ ($0 \leq X2 \leq 1$, $0 \leq Y2 \leq 1$, $0 \leq X2+Y2 \leq 1$) film and the second conductive type $Al_{X3}In_{Y3}Ga_{1-X3-Y3}N$ ($0 \leq X3 \leq 1$, $0 \leq Y3 \leq 1$, $0 \leq X3+Y3 \leq 1$) film have excellent surface morphology.

In one example, the epitaxial substrate includes:
the thickness of n-type GaN substrate: 400 micrometers;
the thickness of n-type GaN film: 1 micrometer;
undoped $In_{0.15}Ga_{0.85}N$ well layer: 2 nanometers;
undoped $In_{0.01}Ga_{0.99}N$ well layer: 15 nanometers;
p-type AlGaN layer: 20 nanometers;
p-type GaN layer: 50 nanometers.

Figure 11:
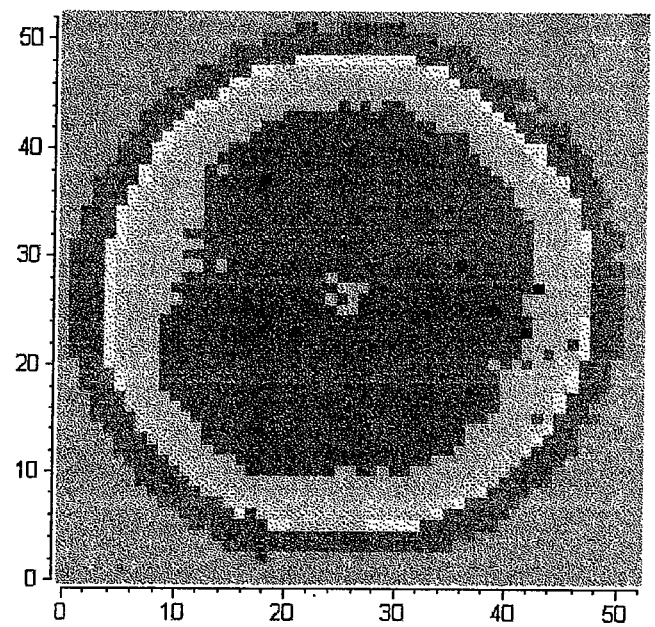
FIG. 11 is a view showing the distribution of photo-luminescence wavelength of the epitaxial wafer formed by the method in FIG. 2 and showing the histogram of this distribution.
Figure 11:
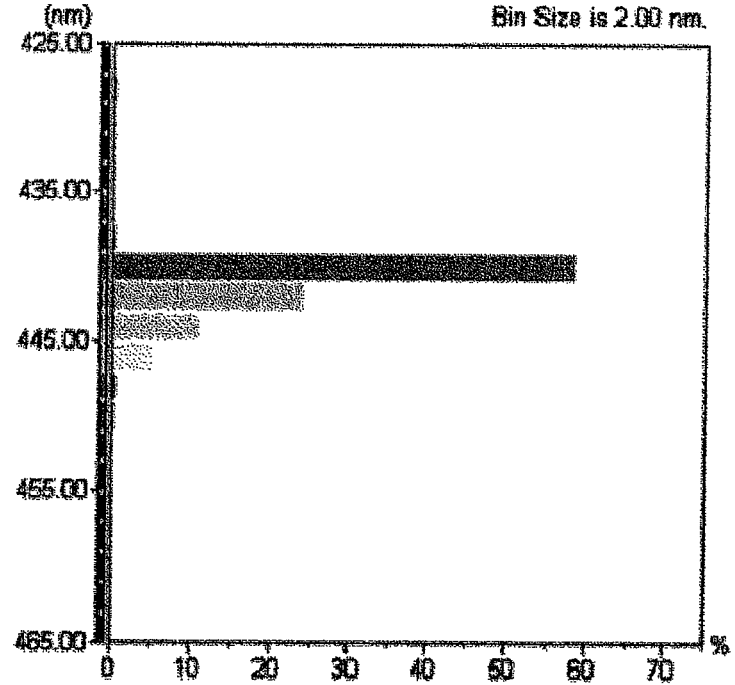
Figure 12:
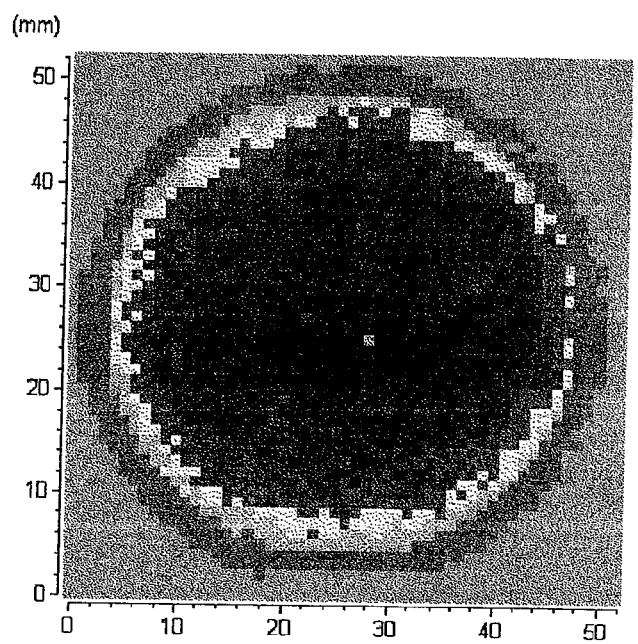
FIG. 12 is a view showing the distribution of photo-luminescence intensity of the epitaxial wafer formed by the method in FIG. 2 and showing the histogram of this distribution.
Figure 12:
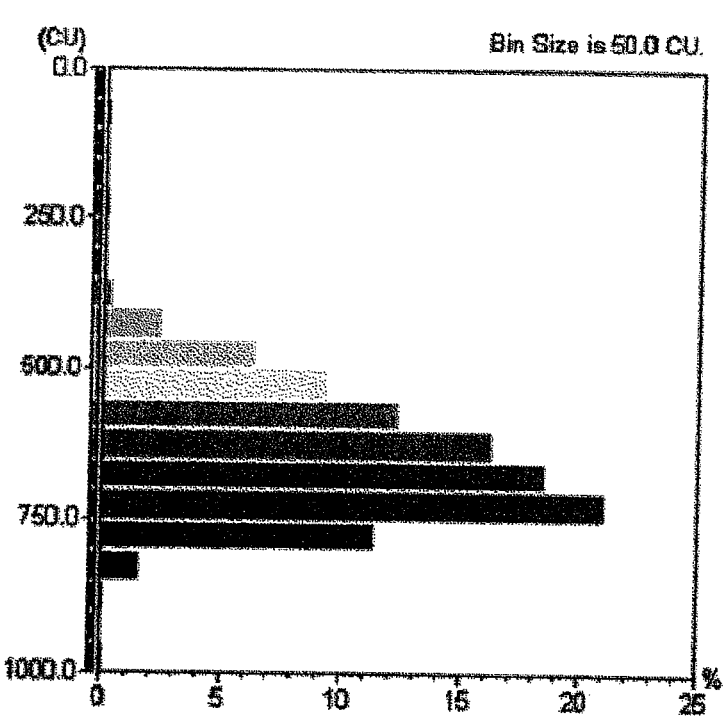

Part (A) in FIG. 11 shows the distribution of photoluminescence wavelength of the epitaxial substrate that uses the substrate formed by the method in part (A) in FIG. 2. Part (B) in FIG. 11 shows the histogram of the wavelength distribution of part (A) in FIG. 11. The variation of the off-angle on the primary surface is in the range of 0.15 to 0.7 degrees. Part (A) in FIG. 12 shows the distribution of photoluminescence intensity of the epitaxial substrate that uses the substrate formed by the method in part (A) in FIG. 2. Part (B) in FIG. 11 shows the histogram of the intensity distribution of part (A) in FIG. 11. Parts (A) of FIGS. 11 and 12 show the measurement for epitaxial substrates fabricated by use of 2-inch GaN substrates.

Parts (A) and (B) in FIG. 11 reveal average of 441.5 nanometers, standard deviation of 1.65 nanometers and distribution width of −2 nanometers to +2 nanometers.

According to the measurement in parts (A) and (B) of FIG. 12, value (SIG/AVE) derived by dividing the standard deviation SIG of the intensity by the average AVE of the intensity is about 15%. This shows the emitting is substantially uniform over the surface. On the contrary, in the substrate having off-angle variation in the range of zero to 0.15 degrees (exclusive) and more than 2 degrees, the photoluminescence intensity is lowered and the photoluminescence wavelength is shifted to a longer wavelength region, which lower the semiconductor device yield.

Having described and illustrated the principle of the invention in a preferred embodiment thereof, it is appreciated by those having skill in the art that the invention can be modified in arrangement and detail without departing from such principles. Details of structures of these devices can be modified as necessary. For example, although semiconductor light-emitting diodes are described in the embodiment, the present invention is not limited to the specific examples disclosed in the embodiments. Further, a GaN film formed on the GaN substrate is explained in the embodiment, but III-group nitride semiconductor ($Al_XIn_YGa_{1-X-Y}N$, $0 \leq X \leq 1$, $0 \leq Y \leq 1$, $0 \leq X+Y \leq 1$) can be formed. We therefore claim all modifications and variations coming within the spirit and scope of the following claims.

What is claimed is:

1. A method of fabricating a III-group nitride semiconductor device, the method comprising steps of:
cutting an ingot of single crystal gallium nitride along predetermined planes to make one or more single crystal gallium nitride substrates, the ingot of single crystal gallium nitride being grown by vapor phase epitaxy in a direction of a predetermined axis, each predetermined plane being inclined to the predetermined axis, each substrate having a mirror polished primary surface, the primary surface having a first area and a second area, the first area being between an edge of the substrate and a line 3 millimeter away from the edge, the first area surrounding the second area, an axis perpendicular to the primary surface forming an off-angle with c-axis of the substrate, the off-angle taking a minimum value at a first position in the first area of the primary surface;
growing a III-group nitride layer on the primary surface of the substrate;
growing a III-group nitride active layer on the III-group nitride layer after growing the III-group nitride layer;
growing a p-type III-group nitride layer on the III-group nitride active layer after growing the III-group nitride active layer; and
forming a p-type electrode on the p-type III-group nitride layer and an n-type electrode on a backside surface of the substrate.

2. The method according to claim 1, wherein an axis perpendicular to the primary surface forms an angle greater than zero with c-axis of the substrate.

3. The method according to claim 1, wherein the off angle takes a maximum value at a second position on the primary surface, and the off angle makes substantially monotonic change on a segment from the first position to the second position.

4. The method according to claim 1, wherein the off angle takes a nonzero constant value on a curve on the primary surface and the curve terminates at the edge of the primary surface.

5. A method of fabricating a III-group nitride semiconductor device, the method comprising steps of:
slicing an ingot of single crystal gallium nitride along predetermined planes to prepare one or more single crystal gallium nitride slices, each predetermined plane being inclined to a predetermined axis, the ingot of single crystal gallium nitride being grown by vapor phase epitaxy, and each single crystal gallium nitride slice having a slice surface;
performing at least one process of polishing and grinding of the slice surface to form one or more single crystal gallium nitride substrates, each substrate having a primary surface, the primary surface having a first area and a second area, the first area being between an edge of the substrate and a line 3 millimeters away from the edge, the first area surrounding the second area, an axis perpendicular to the primary surface forming an off-angle with c-axis of the substrate, the off-angle taking a minimum value at a first position in the first area of the primary surface;
growing a III-group nitride layer on the primary surface of the substrate;
growing a III-group nitride active layer on the III-group nitride layer after growing the III-group nitride layer;

growing a p-type III-group nitride layer on the III-group nitride active layer after growing the III-group nitride active layer; and forming a p-type electrode on the p-type III-group nitride layer and an n-type electrode on a backside surface of the substrate.

6. The method according to claim 5, wherein an axis perpendicular to the primary surface forms an angle greater than zero with c-axis of the substrate.

7. The method according to claim 5, wherein the off angle takes a maximum value at a second position on the primary surface, and the off angle makes substantially monotonic change on a segment from the first position to the second position.

8. The method according to claim 5, wherein the off angle takes a nonzero constant value on a curve on the primary surface and the curve terminates at the edge of the primary surface.

9. The method according to claim 1, wherein the III-group nitride active layer includes one of a multi quantum well (MQW) structure and a single quantum well (SQW) structure.

10. The method according to claim 1, wherein a conductive type of the III-group nitride layer is n-type.

11. The method according to claim 1, further comprising a step of growing another p-type III-group nitride layer on the III-group nitride active layer prior to the step of growing the p-type III-group nitride layer.

12. The method according to claim 8, wherein the III-group nitride active layer includes one of a multi quantum well (MQW) structure and a single quantum well (SQW) structure.

13. The method according to claim 8, wherein a conductive type of the III-group nitride layer is n-type.

14. The method according to claim 8, further comprising a step of growing another p-type III-group nitride layer on the III-group nitride active layer prior to the step of growing the p-type III-group nitride layer.

* * * * *